United States Patent
Gu et al.

(10) Patent No.: US 7,911,034 B2
(45) Date of Patent: *Mar. 22, 2011

(54) TECHNIQUES FOR PRECISION PATTERN TRANSFER OF CARBON NANOTUBES FROM PHOTO MASK TO WAFERS

(75) Inventors: Shiqun Gu, San Diego, CA (US); Peter G. McGrath, Portland, OR (US); James Elmer, Vancouver, WA (US); Richard J. Carter, Dresden (DE); Thomas Rueckes, Rockport, MA (US)

(73) Assignee: Nantero, Inc., Woburn, MA (US)

( * ) Notice: Subject to any disclaimer, the term of this patent is extended or adjusted under 35 U.S.C. 154(b) by 14 days.

This patent is subject to a terminal disclaimer.

(21) Appl. No.: 12/471,175

(22) Filed: May 22, 2009

(65) Prior Publication Data
US 2009/0294754 A1   Dec. 3, 2009

Related U.S. Application Data

(63) Continuation of application No. 11/298,274, filed on Dec. 8, 2005, now Pat. No. 7,538,040.

(60) Provisional application No. 60/696,336, filed on Jun. 30, 2005.

(51) Int. Cl.
*H01L 29/12* (2006.01)

(52) U.S. Cl. . 257/613; 438/717; 438/743; 257/E21.023; 977/742

(58) Field of Classification Search .................. 438/717, 438/743; 257/E21.023, E21.029, 613; 977/742
See application file for complete search history.

(56) References Cited

U.S. PATENT DOCUMENTS

| | | | |
|---|---|---|---|
| 6,706,402 B2 | 3/2004 | Rueckes et al. | |
| 7,538,040 B2 * | 5/2009 | Gu et al. | 438/717 |
| 2004/0099438 A1 * | 5/2004 | Arthur et al. | 174/257 |
| 2004/0181630 A1 | 9/2004 | Jaiprakash et al. | |
| 2009/0095704 A1 * | 4/2009 | Mao et al. | 216/13 |

* cited by examiner

*Primary Examiner* — Trung Dang
(74) *Attorney, Agent, or Firm* — Wilmer Cutler Pickering Hale and Dorr LLP

(57) ABSTRACT

A method for patterning CNTs on a wafer wherein a CNT layer is provided on a substrate, a hard mask film is deposited on the CNT layer, a BARC layer (optional) is coated on the hard mask film, and a resist is patterned on the BARC layer (or directly on the hard mask film if the BARC layer is not included). Then, the resist pattern is effectively transferred to the hard mask film by etching the BARC layer (if provided) and etching partly into, but not entirely through, the hard mask film (i.e., etching is stopped before reaching the CNT layer). Then, the resist and the BARC layer (if provided) is stripped, and the hard mask pattern is effectively transferred to the CNTs by etching away (preferably by using Cl, F plasma) the portions of the hard mask which have been already partially etched away.

16 Claims, 5 Drawing Sheets

TECHNIQUES FOR PRECISION PATTERN TRANSFER OF CARBON NANOTUBES FROM PHOTO MASK TO WAFERS

CROSS REFERENCE TO RELATED APPLICATIONS

This application is a continuation of and claims priority under U.S.C. §120 to U.S. patent application Ser. No. 11/298,274, filed Dec. 8, 2005, entitled Novel Techniques for Precision Pattern Transfer of Carbon Nanotubes from Photomask to Wafers, which claims the benefit of U.S. Provisional Application Ser. No. 60/696,336, filed Jun. 30, 2005, the entire disclosure of each are hereby incorporated herein by reference in their entirety.

BACKGROUND

The present invention generally relates to carbon nanotubes, and more specifically relates to a technique for precisely transferring a carbon nanotube pattern from a photomask to a wafer.

Carbon nanotube technology is fast becoming a technological area to make an impact in electronic devices. Single-wall carbon nanotubes (CNTs) are quasi-one dimensional nanowires, which exhibit either metallic of semiconducting properties, depending upon their chirality and radius. Single-wall nanotubes have been demonstrated as both semiconducting layers in thin film transistors as well as metallic interconnects between metal layers.

Currently, there are two approaches which are being used to pattern CNTs (i.e., to transfer a carbon nanotube pattern from a photomask to a wafer):

FIGS. 1-3 illustrate a first method which is currently used. In each one of FIGS. 1-3, a top view is provided on the left, and a side view is provided on the right. In the method, as shown in FIG. 1, initially a CNT layer 10 is provided on a substrate 12 and a resist 14 is patterned on the CNT layer 10. Then, as shown in FIG. 2, $O_2$ plasma is used to etch the CNTs 10 (i.e., from the locations identified by reference numeral 16). Then, as shown in FIG. 3, the resist is stripped using wet chemistry.

Disadvantages of this method include the fact that the $O_2$ plasma tends to lateral etch both the CNTs and resist. Where the resist lateral dimension reduces, the final CNTs pattern line width also decreases as indicated in the progression of FIG. 1 to FIG. 2, wherein the width of both the CNTs and the resist has decreased (despite the fact that the plasma etching was intended to merely etch any CNT which was not covered by the resist). Actually, the higher the pressure of the $O_2$ plasma, the more dimension loss there tends to be. In addition, it is usually difficult to use wet strip chemistry to strip the organic antireflective layer (i.e., the resist). Therefore, resist patterning often remains on the (CNTs), and this may lead to high reflectance for the pattern light, and poor profile for the resist patterns. All this results in difficult control of the critical dimension of the CNT pattern.

FIGS. 4-6 illustrate a first method which is currently used. In each one of FIGS. 4-6, a top view is provided on the left, and a side view is provided on the right. In the method, as shown in FIG. 4, initially a CNT layer 10 is provided on a substrate 12, a hard mask layer 13 is provided on the CNT layer 10, and a resist 14 is patterned on 5 the hard mask layer 13. Then, as shown in FIG. 5, the hard mask 13 and the CNT layer 10 is etched away (i.e., those portions which are not covered by the resist—identified with reference numeral 16 in FIG. 5). Finally, as shown in FIG. 6, the resist is ashed away using $O_2$ plasma.

Disadvantages of this method include the fact that after the hard mask and CNT layers are etched, the $O_2$ plasma which is used to ash the resist attacks the CNTs from the hard mask sidewall (i.e., the plasma undercuts the hard mask and attacks the CNTs underneath). This results in a resulting, physical CNT pattern which is narrower than that of the design.

OBJECTS AND SUMMARY

An object of an embodiment of the present invention is to provide an improved technique for transferring a carbon nanotube pattern to a wafer.

Another object of an embodiment of the present invention is to provide a method for patterning CNTs on a wafer where the CNTs do not become exposed to high $O_2$ plasma during patterning.

Still another object of an embodiment of the present invention is to provide a method for patterning CNTs on a wafer where the critical dimension of the CNTs are maintained.

Briefly, and in accordance with at least one of the foregoing objects, an embodiment of the present invention provides a method for patterning CNTs on a wafer wherein a CNT layer is provided on a substrate, a hard mask film is deposited on the CNT layer, a BARC layer (optional) is coated on the hard mask film, and a resist is patterned on the BARC layer (or directly on the hard mask film if the BARC layer is not included). Then, the resist pattern is effectively transferred to the hard mask film by etching the BARC layer (if provided) and etching partly into, but not entirely through, the hard mask film (i.e., etching is stopped before reaching the CNT layer). Then, the resist and the BARC layer (if provided) is stripped, such as by using $O_2$ plasma. Finally, the hard mask pattern is effectively transferred to the CNTs by etching away (preferably by using a Cl, F based plasma) the portions of the hard mask which have been already partially etched in a previous step.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
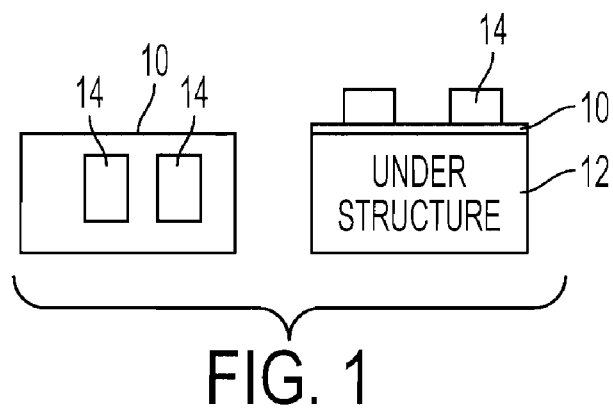
FIGS. 1-3 are views which relate to a currently used method of patterning CNTs on a wafer.

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

Figure 2:
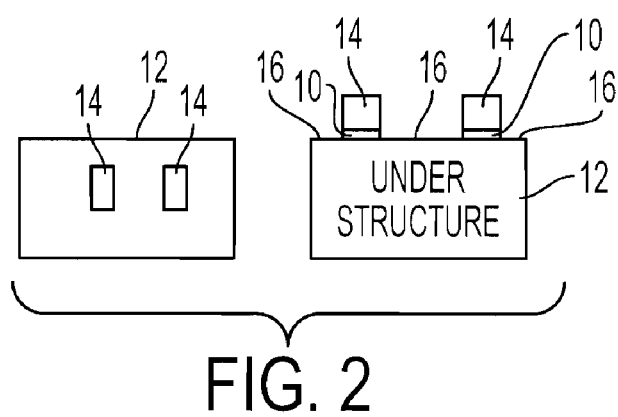
Figure 3:
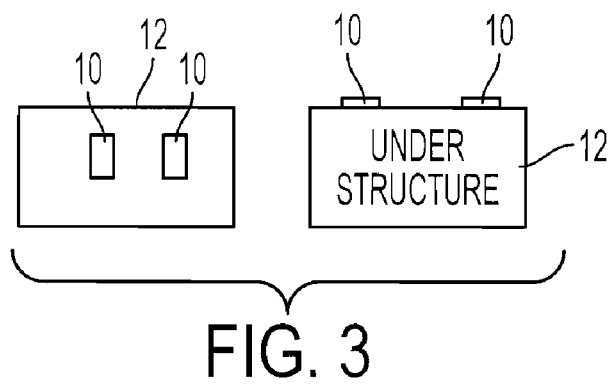
Figure 4:
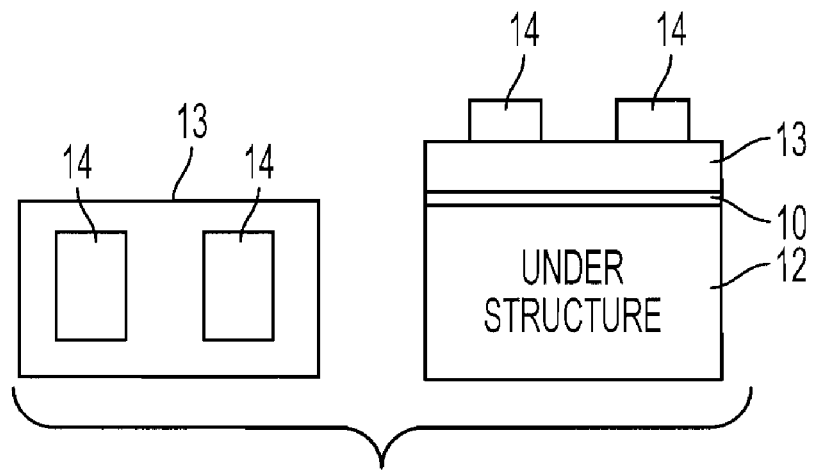
FIGS. 4-6 are views which relate to another currently used method of patterning CNTs on a wafer.
Figure 5:
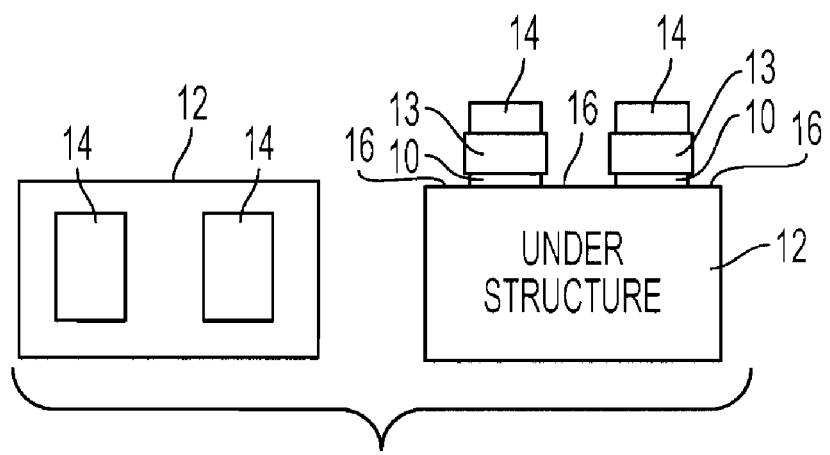
Figure 6:
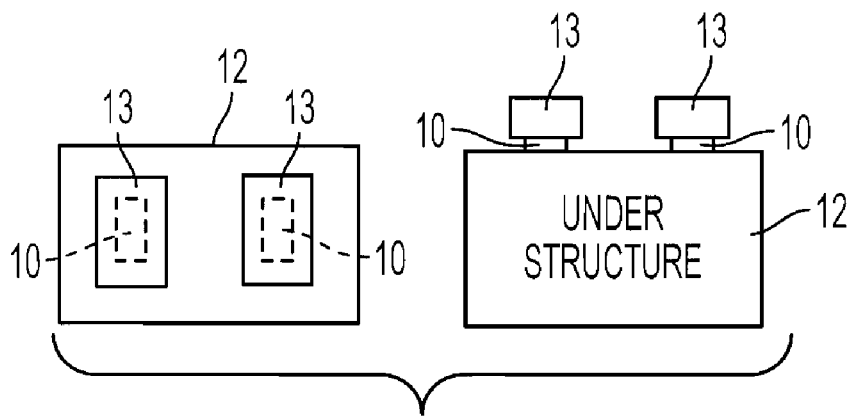

As described above in connection with FIGS. 1 and 2, $O_2$ plasma typically not only etches CNTs but also attacks the resist. Hence, it is desirable to minimize exposure of CNTs to $O_2$ plasma during patterning. A method which is in accordance with an embodiment of the present invention is illustrated in FIG. 7(a), and FIGS. 8-11 provides views which relate to the method shown in FIG. 7(a). In each one of FIGS. 8-11, a top view is provided on the left, and a side view is provided on the right.

Figure 7A:
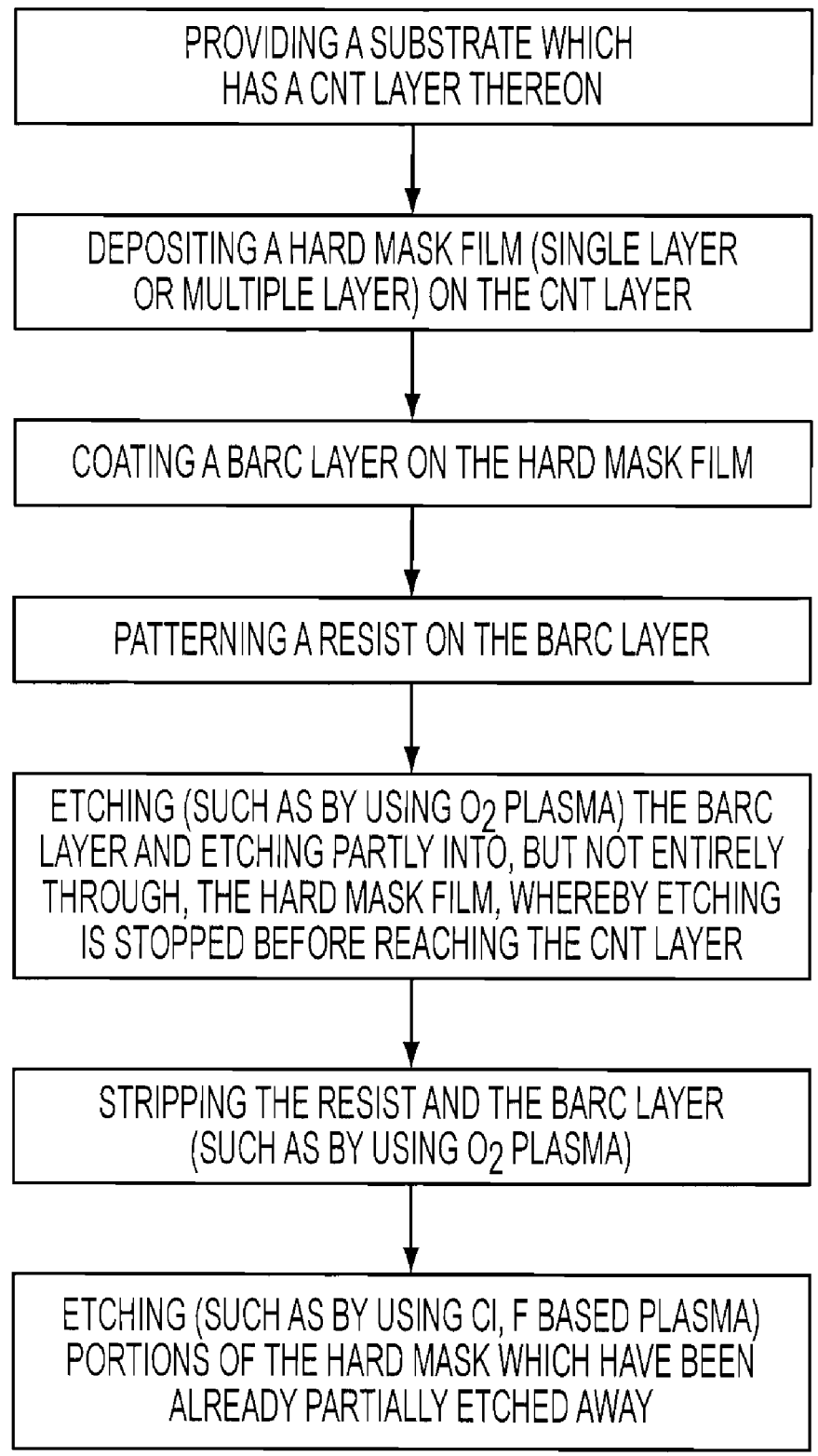
FIGS. 7(a) and 7(b) are block diagram which set forth the steps of methods of patterning CNTs on a wafer, where the methods are in accordance with embodiments of the present invention.
Figure 8:
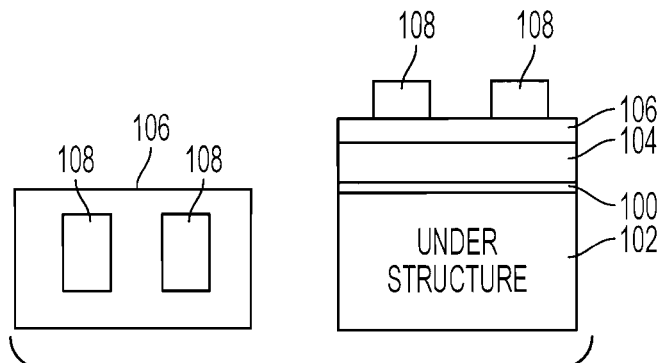
FIGS. 8-11 are views which relate to the method illustrated in FIG. 7(a).
Figure 9:
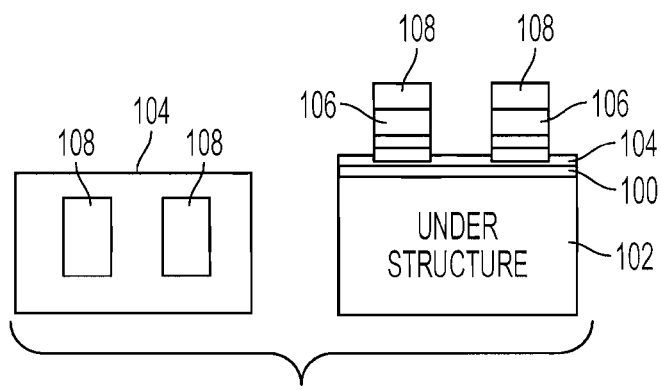
Figure 10:
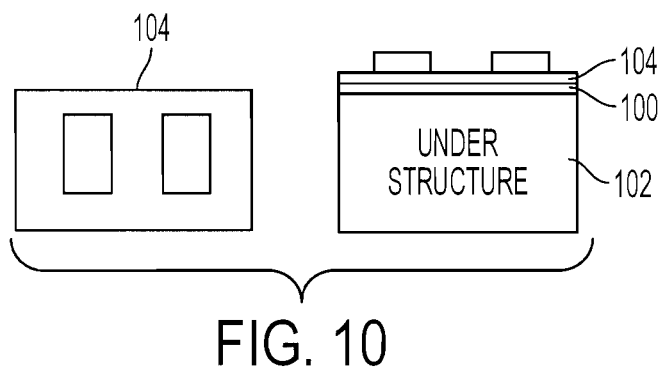
Figure 11:
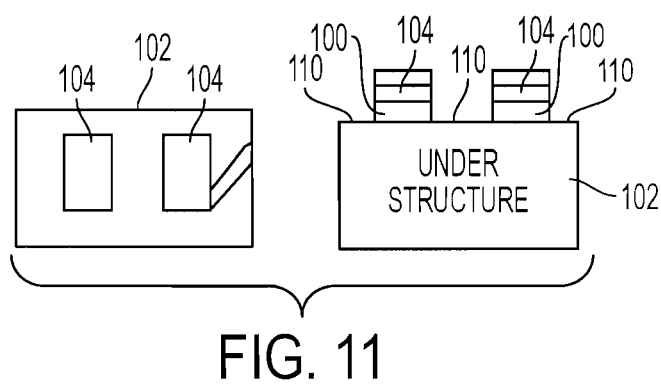

As shown in FIGS. 7(a) and 8, the method provides that initially a CNT layer 100 is provided on a substrate 102, a hard mask film 104 (the hard mask film 104 could be binary to improve the etch control) is deposited on the CNT layer 100, a BARC layer 106 (optional) is coated on the hard mask film 104, and a resist 108 is patterned on the BARC layer 106 (or directly on the hard mask film if the BARC layer is not included). Then, as shown in FIGS. 7(a) and 9, the resist pattern is effectively transferred to the hard mask film 104 by etching the BARC layer 106 (if provided) (such as by using $O_2$ plasma or other plasma such as Cl, F) and etching partly into, but not entirely through, the hard mask film 104 (i.e., etching is stopped before reaching the CNT layer 100). While a binary hard mask layer will make the etch a little easier, it is not required. Then, as shown in FIGS. 7(a) and 10, the resist 108 and the BARC layer 106 (if provided) are stripped, such as by using $O_2$ plasma. Finally, as shown in FIGS. 7(a) and 11, the hard mask pattern is effectively transferred to the CNTs by etching away (preferably by using a highly directional plasma, such as a Cl, F based plasma) the portions of the hard mask 104 which have been already partially etched in a previous step (i.e., from the areas identified with reference numeral 110). With regard to the hard mask, either a dual layer hard mask can be used wherein only a top layer of the hard mask is initially etched away, or a single layer hard mask can be used but where the etching stops before the CNTs are reached.

Figure 7B:
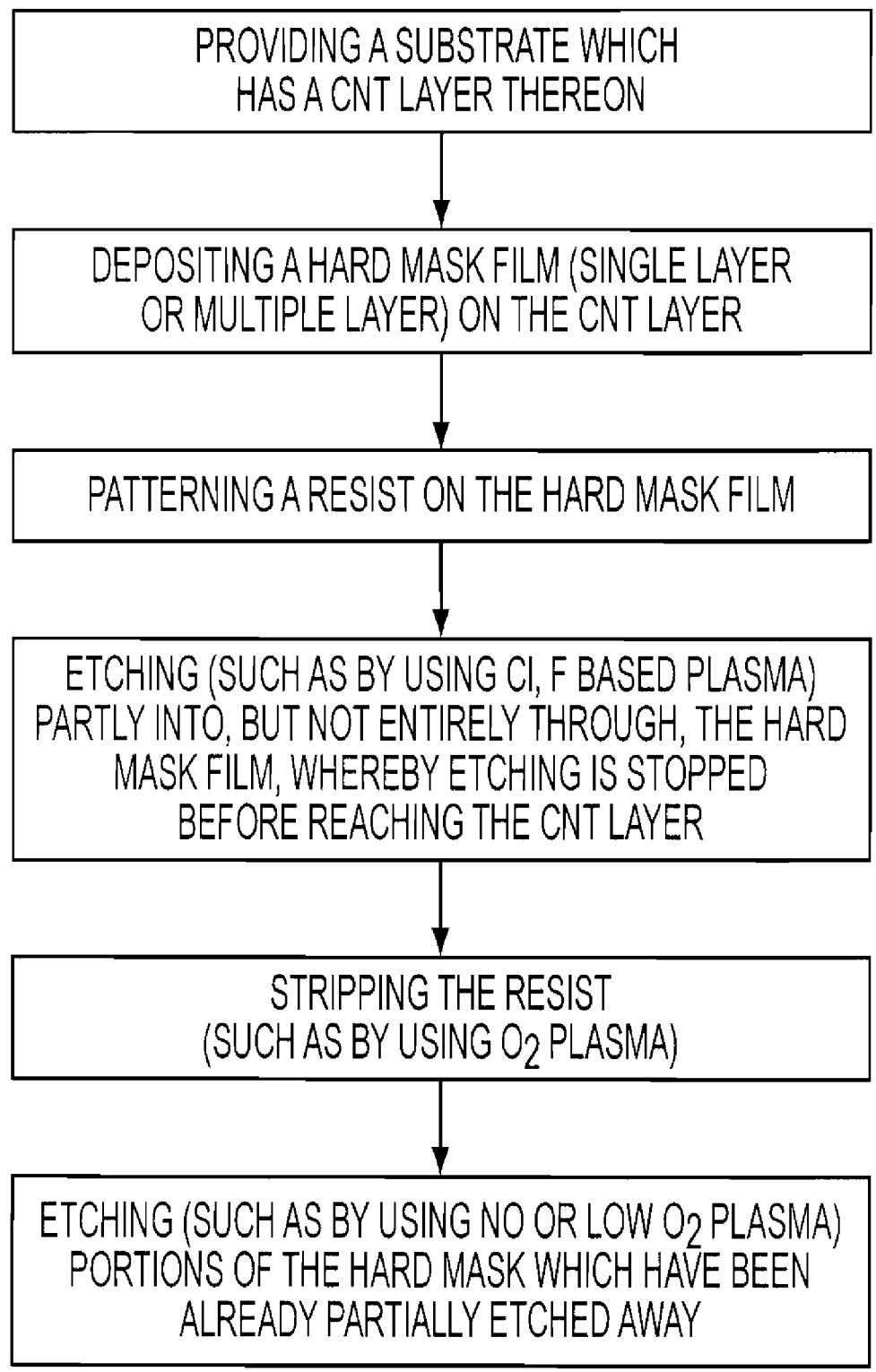

As mentioned above, the BARC layer is optional. FIG. 7(b) illustrates effectively the same method but where the BARC layer is not included.

Advantages of the present invention include the fact that the CNTs are not exposed to $O_2$ plasma during patterning, a BARC layer can be used for the photomask step, and the critical dimension is maintained from the resist pattern to the CNT patterns. The present invention can be applied to any application which needs pattern CNTs.

While embodiments of the present invention are shown and described, it is envisioned that those skilled in the art may devise various modifications of the present invention without departing from the spirit and scope of the appended claims.

The invention claimed is:

1. A semiconductor device having a pattern of carbon nanotubes (CNT), wherein the semiconductor device is patterned according to the following method:
   providing a substrate, wherein the substrate has a CNT layer thereon;
   depositing a hard mask film on the CNT layer;
   coating a BARC layer on the hard mask film;
   patterning a resist on the BARC layer;
   etching the BARC layer;
   etching partly into, but not entirely through, the hard mask film, whereby etching is stopped before reaching the CNT layer;
   stripping the resist and the BARC layer; and
   etching away portions of the hard mask which have been already partially etched away.

2. The semiconductor device as recited in claim 1, wherein the step of etching the BARC layer comprises using $O_2$ plasma or other plasma such as Cl, F.

3. The semiconductor device as recited in claim 1, wherein the step of etching partly into, but not entirely through, the hard mask film, comprises using F or Cl based plasma.

4. The semiconductor device as recited in claim 1, wherein the step of stripping the resist and the BARC layer comprises using $O_2$ plasma.

5. The semiconductor device as recited in claim 1, wherein the step of etching away portions of the hard mask which have been already partially etched away comprises using no $O_2$ plasma.

6. The semiconductor device as recited in claim 1, wherein the step of etching away portions of the hard mask which have been already partially etched away comprises using low $O_2$ plasma.

7. The semiconductor device as recited in claim 1, wherein the step of depositing a hard mask film on the CNT layer comprises depositing a single layer hard mask, and wherein said step of etching partly into, but not entirely through, the hard mask film comprises etching away less than all of a thickness of said single layer.

8. The semiconductor device as recited in claim 1, wherein the step of depositing a hard mask film on the CNT layer comprises depositing a multiple layer hard mask, and wherein said step of etching partly into, but not entirely through, the hard mask film comprises etching away less than all the layers of the hard mask film.

9. A semiconductor device having a pattern of carbon nanotubes (CNT), wherein the semiconductor device is patterned according to the following method:
   providing a substrate, wherein the substrate has a CNT layer thereon;
   depositing a hard mask film on the CNT layer;
   patterning a resist on the CNT layer;
   etching partly into, but not entirely through, the hard mask film, whereby etching is stopped before reaching the CNT layer;
   stripping the resist; and
   etching away portions of the hard mask which have been already partially etched away.

10. The semiconductor device as recited in claim 9, wherein the step of etching partly into, but not entirely through, the hard mask film, comprises using F or Cl-based plasma.

11. The semiconductor device as recited in claim 9, wherein the step of stripping the resist and the BARC layer comprises using $O_2$ plasma.

12. The semiconductor device as recited in claim 9, wherein the step of etching away portions of the hard mask which have been already partially etched away comprises using no $O_2$ plasma.

13. The semiconductor device as recited in claim 9, wherein the step of etching away portions of the hard mask which have been already partially etched away comprises using low $O_2$ plasma.

14. The semiconductor device as recited in claim 9, wherein the step of depositing a hard mask film on the CNT layer comprises depositing a single layer hard mask, and wherein said step of etching partly into, but not entirely through, the hard mask film comprises etching away less than all of the thickness of said single layer.

15. The semiconductor device as recited in claim 9, wherein the step of depositing a hard mask film on the CNT layer comprises depositing a multiple layer hard mask, and wherein said step of etching partly into, but not entirely through, the hard mask film comprises etching away less than all the layers of the hard mask film.

16. A semiconductor device comprising:
 a substrate;
 a pattern of carbon nanotubes on the substrate,
 wherein the pattern is created by etching carbon nanotubes according to a pattern on a mask having critical dimensions;
 wherein the pattern of the carbon nanotubes maintains the critical dimensions of the pattern on the mask.

* * * * *

UNITED STATES PATENT AND TRADEMARK OFFICE
CERTIFICATE OF CORRECTION

| | | |
|---|---|---|
| PATENT NO. | : 7,911,034 B2 | Page 1 of 1 |
| APPLICATION NO. | : 12/471175 | |
| DATED | : March 22, 2011 | |
| INVENTOR(S) | : Shiqun Gu et al. | |

It is certified that error appears in the above-identified patent and that said Letters Patent is hereby corrected as shown below:

On the Title page of the patent, the title should read as follows:

Item (54) "Novel Techniques for Precision Pattern Transfer of Carbon Nanotubes from Photo Mask to Wafers"

In the Specifications:

In Column 1, line 1, the Title should read as follows:

"Novel Techniques for Precision Pattern Transfer of Carbon Nanotubes from Photo Mask to Wafers"

Signed and Sealed this
Sixteenth Day of August, 2011

David J. Kappos
*Director of the United States Patent and Trademark Office*

UNITED STATES PATENT AND TRADEMARK OFFICE
CERTIFICATE OF CORRECTION

PATENT NO. : 7,911,034 B2  
APPLICATION NO. : 12/471175  
DATED : March 22, 2011  
INVENTOR(S) : Shiqun Gu et al.

Page 1 of 1

It is certified that error appears in the above-identified patent and that said Letters Patent is hereby corrected as shown below:

<u>Title Page, Item [54] and at Column 1 line 1, Title</u>, the word "NOVEL" (as inserted by Certificate of Correction issued August 16, 2011) is to be deleted and title is reinstated to read
-- TECHNIQUES FOR PRECISION PATTERN TRANSFER OF CARBON NANOTUBES FROM PHOTO MASK TO WAFERS --.

Signed and Sealed this
Sixth Day of September, 2011

David J. Kappos
*Director of the United States Patent and Trademark Office*